(12) United States Patent
Kitayama et al.

(10) Patent No.: US 6,515,268 B1
(45) Date of Patent: Feb. 4, 2003

(54) PHOTOELECTRIC CONVERTER HAVING A LIGHT RECEIVING PORTION WITH AN IMPROVED READOUT GATE

(75) Inventors: Satoshi Kitayama, Kagoshima (JP); Kazushige Nigawara, Tokyo (JP); Tsuyoshi Sasaki, Kagoshima (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/453,592

(22) Filed: Dec. 3, 1999

(30) Foreign Application Priority Data

Dec. 4, 1998 (JP) .......................................... 10-345559

(51) Int. Cl.$^7$ ............................................... H01L 27/00
(52) U.S. Cl. .................................. 250/208.1; 348/315
(58) Field of Search ..................... 250/208.1; 257/240; 348/315, 322

(56) References Cited

U.S. PATENT DOCUMENTS 5,365,093 A * 11/1994 Kuno .......................... 257/233
5,514,886 A * 5/1996 Stevens et al. ............. 257/221

* cited by examiner

Primary Examiner—Stephone Allen
Assistant Examiner—Bradford Hill
(74) Attorney, Agent, or Firm—Sonnenschein, Nath & Rosenthal

(57) ABSTRACT

A photoelectric converter with improved charge transfer efficiency from a light receiving portion. The photoelectric converter includes a light receiving portion having an output end and a gate portion having a first side and a second side that both define a readout gate width for the light receiving portion, where the first side of the gate portion confronts the output end of the light receiving portion. The photoelectric converter also includes a charge transfer portion formed to confront the second side of the gate portion, where the readout gate width of said gate portion is wider at the first side confronting said light receiving portion than at the second side confronting said charge transfer portion.

10 Claims, 7 Drawing Sheets

$1_{1-4} = 1_{1-1}, W_4 > W_1, W_4' = W_1$

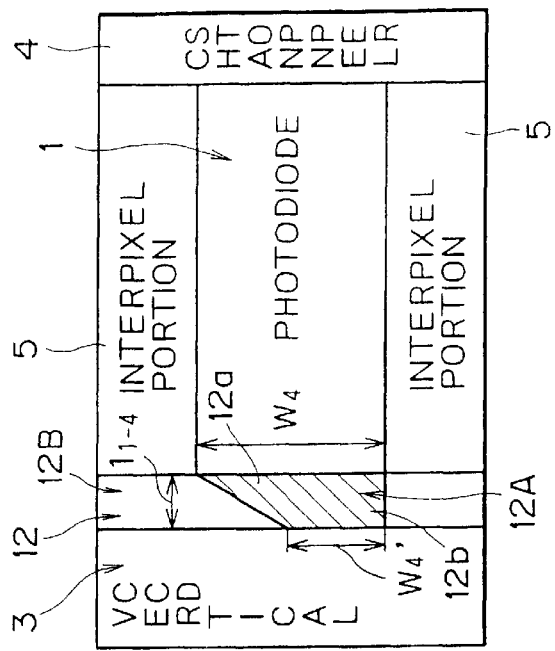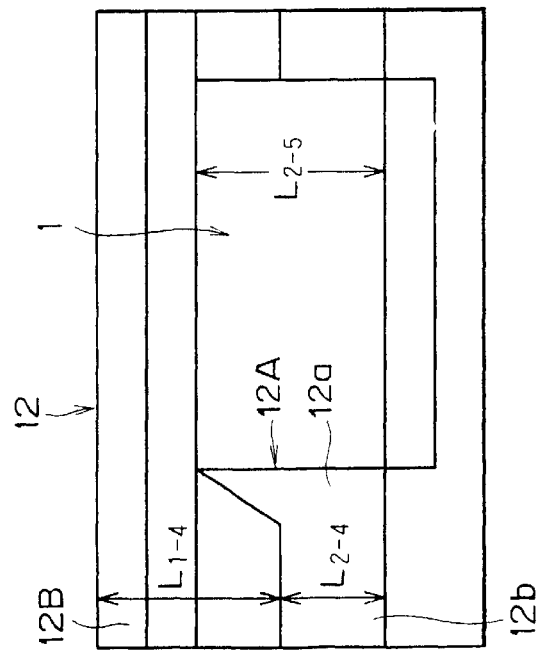

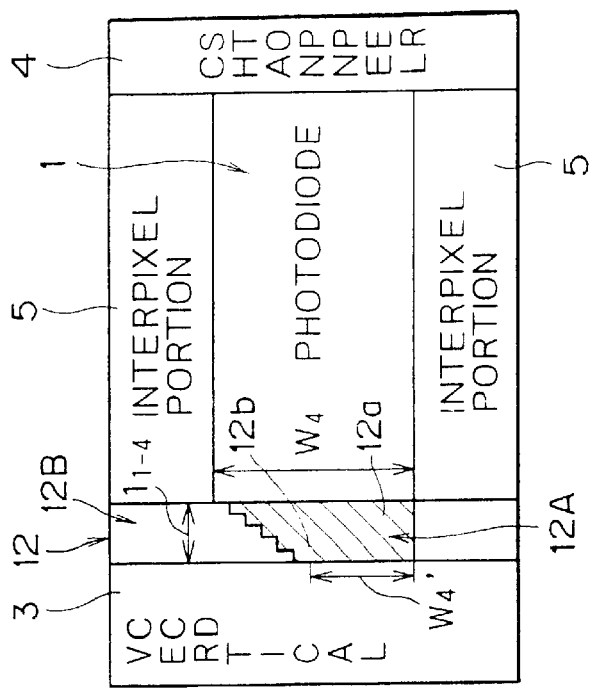
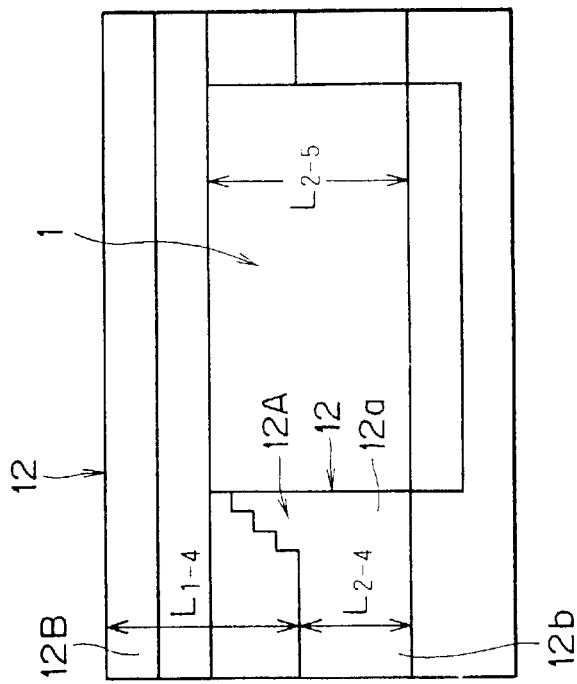

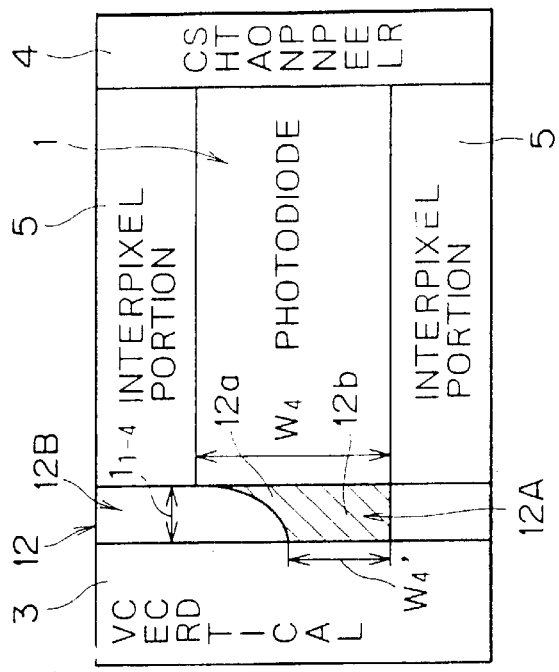
FIG. 3A
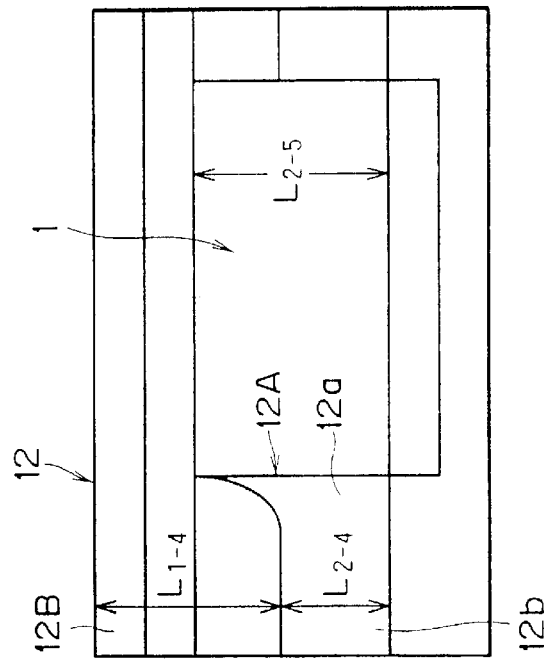
FIG. 3B
$L_{2-4} = L_{2-1}$, $L_{1-4} = L_{1-1}$, $L_{2-5} > L_{2-1}$
$l_{1-4} = l_{1-1}$, $W_4 > W_1$, $W_4' = W_1$
 GATE WHICH IS NOT RELATED TO READOUT
 READOUT GATE

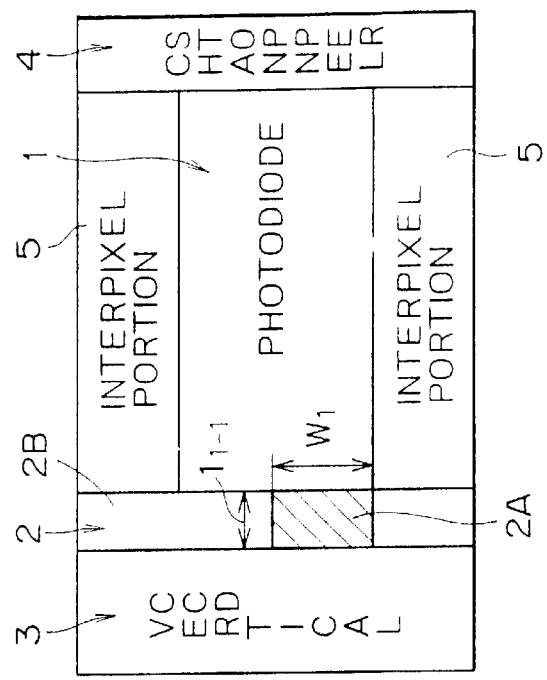
FIG. 4B (RELATED ART)
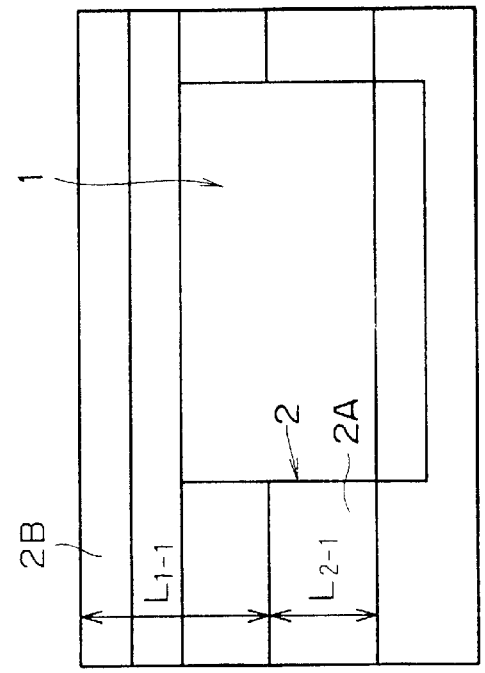
FIG. 4A (RELATED ART)
 GATE WHICH IS NOT RELATED TO READOUT
 READOUT GATE $L_{1-3} = L_{1-1}, L_{2-3} = L_{2-1}$ $l_{1-3} < l_{1-1}, W_3 = W_1$

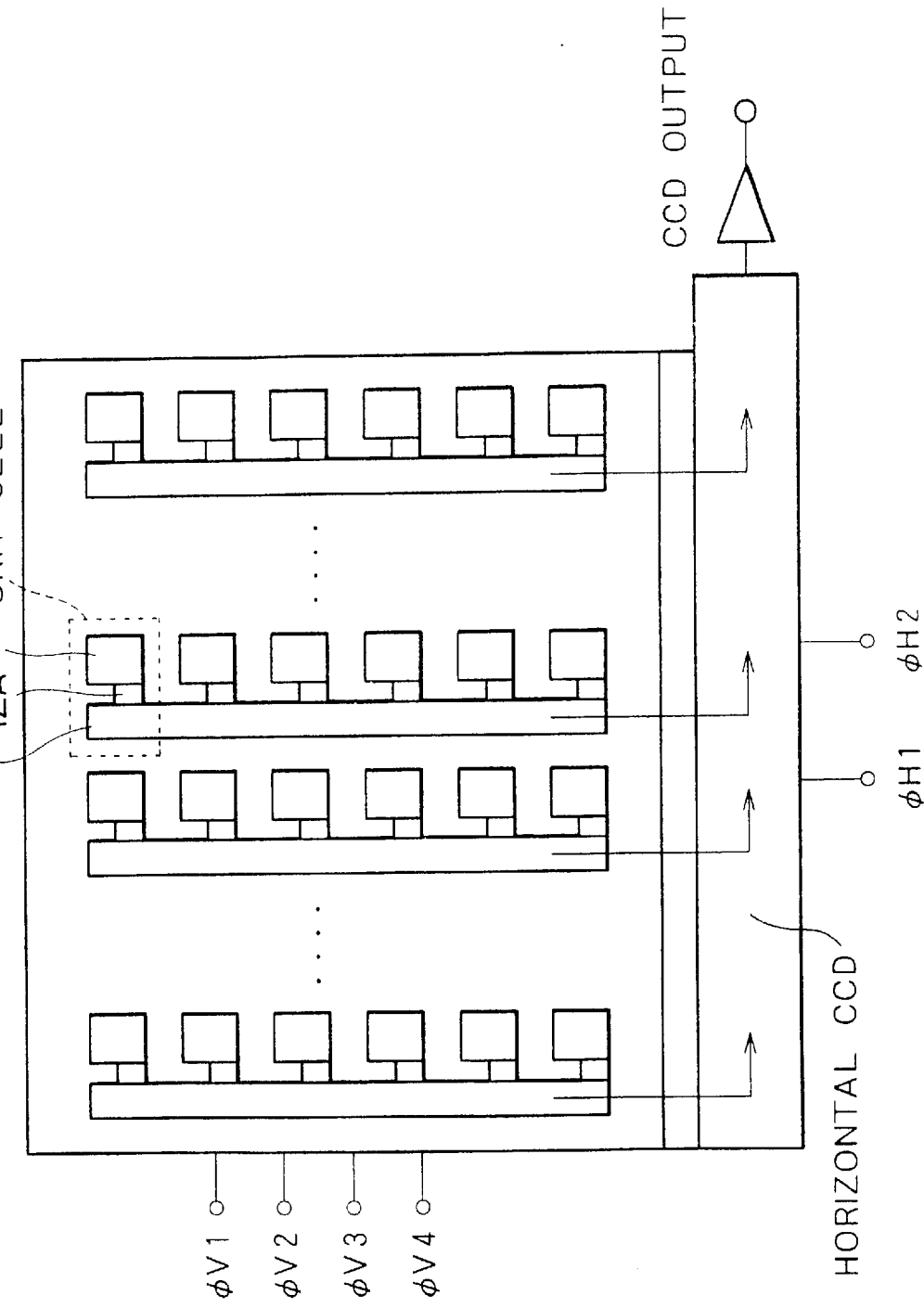

PHOTOELECTRIC CONVERTER HAVING A LIGHT RECEIVING PORTION WITH AN IMPROVED READOUT GATE

RELATED APPLICATION DATA

The present application claims priority to Japanese Application No. P10-345559 filed Dec. 4, 1998 which application is incorporated herein by reference to the extent permitted by law.

BACKGROUND OF THE INVENTION

1. Field of the Invention

The present invention relates to a photoelectric converter such as an imaging apparatus employing photoelectric conversion devices such as photodiodes.

2. Description of Related Art

An imaging apparatus has a number of pixels formed in an imaging area (a light receiving portion) thereof receive light signals from a subject, photoelectrically converts the light signals into signal charges, transfers the converted electric signals, thereby imaging the subject.

FIG. 7 shows a CCD imaging apparatus as an example of an imaging apparatus.

Light incident on a photodiode 1 is photoelectrically converted into a signal charge, the signal charge is read out to a vertical CCD portion 3 via a readout gate 12A, the signal charge is transferred by supplying transfer clocks of, e.g. $\phi V1$ to $\phi V4$ to the vertical CCD 3, and the signal charge is directed to an output portion in a horizontal CCD portion to which transfer clocks of, e.g. $\phi H1$ and $\phi H2$ are supplied, where charge voltage conversion and the like are performed to produce an image signal.

By the way, recent imaging apparatuses, particularly a CCD (charge coupled device) imaging apparatus and the like, tend to have more compact unit cells and increase the amount of charges stored in a sensor to improve sensitivity.

For this reason, it is becoming difficult to read out charges into a vertical CCD, which is a charge transfer portion, from a photodiode comprising a light receiving portion (pixel portion) via a gate portion.

Particularly, as shown in FIGS. 4A and 4B, in the case of an imaging apparatus in which the horizontal size of a unit cell comprising a photodiode portion 1 and a gate portion 2 is longer than the vertical size, it is more difficult to read out charges into a vertical CCD portion 3. FIG. 4A shows a schematic layout of the unit cell from which the vertical CCD portion is excluded, and FIG. 4B shows a schematic layout of the unit cell including the vertical CCD portion (hereinafter the same is also true of other drawings). $L_{2-1}$ or $W_1$ in the drawings is the width of a readout gate 2A and $L_{1-1}$ is the width of a gate 2B which is not related to readout. The reference numeral 4 designates a channel stopper for separating unit cells.

To solve such a problem, the following two measures are taken. One is, as shown in FIGS. 5A and 5B, to enlarge the readout gate width (gate length in a direction orthogonal to a carrier travel direction: the same is true of the following descriptions) $L_{2-2}$ or $W_2$ of a readout gate portion 2A (indicated by white background or oblique lines) of the gate portion 2. The other is, as shown in FIGS. 6A and 6B, to reduce a readout gate length (gate length in a carrier travel direction: the same is true of the following descriptions) $1_{1-3}$.

However, in the layouts of FIGS. 5A and 5B, a ratio between the two gates of the vertical CCD portion 3, that is, a gate 2A to read out charges and a gate 2B which is not related to readout, is different. Consequently, the charge capacity of the vertical CCD portion is liable to become small or charges are liable to be unsuccessfully transferred.

In the layouts of FIGS. 6A and 6B, the gate 2 itself fails to play the role of a barrier during off operation, with the result that charges leak from the photodiode portion 1 to the vertical CCD portion 3 or light passes between a silicon film and a shielding film (both are not shown) below the gates, and photoelectric conversion may occur within the vertical CCD portion 3.

SUMMARY OF THE INVENTION

The present invention has been made in view of the above situation, and its object is to provide a photoelectric converter such as an imaging apparatus which smoothly reads out charges without influencing the charge capacity and charge transfers of a charge transfer portion and can reduce power consumption by reducing a readout voltage.

Specifically, a photoelectric converter of the present invention comprises a light receiving portion, a gate portion, and a charge transfer portion, wherein the gate width of the gate portion is wider at the light receiving portion side than at the transfer portion side.

Thus making a gate width wider at a light receiving portion side than at a charge transfer portion side helps to enlarge an area of an electric field applied to the gate in an area to admit charges from the light receiving portion (accordingly, the electric field of the gate area can be intensified), with the result that charges can be easily read, and if a readout capacity is the same, a charge readout voltage can be reduced to reduce power consumption. Yet, since such an effect can be achieved without changing a gate width at the charge transfer portion side, no influence is exerted on the charge capacity and charge transfers of the charge transfer portion and other characteristics also do not deteriorate.

BRIEF DESCRIPTION OF THE DRAWINGS

FIGS. 1A and 1B show main portions of an imaging apparatus in a first embodiment of the present invention; FIG. 1A is a layout diagram centered on a gate portion, and FIG. 1B is a layout diagram of a unit cell.

FIGS. 2A and 2B show main portions of an imaging apparatus in another embodiment of the present invention; FIG. 2A is a layout diagram centered on a gate portion, and FIG. 2B is a layout diagram of a unit cell.

FIGS. 3A and 3B show main portions of an imaging apparatus in yet another embodiment of the present invention; FIG. 3A is a layout diagram centered on a gate portion, and FIG. 3B is a layout diagram of a unit cell.

FIGS. 4A and 4B show main portions of a conventional imaging apparatus; FIG. 4A is a layout diagram centered on a gate portion, and FIG. 4B is a layout diagram of a unit cell.

FIG. 5A is a layout diagram centered on a gate portion, and FIG. 5B is a layout diagram of a unit cell.

FIG. 6A is a layout diagram centered on a gate portion, and FIG. 6B is a layout diagram of a unit cell.

FIG. 7 shows a CCD imaging apparatus as an example of an imaging apparatus.

DESCRIPTION OF THE PREFERRED EMBODIMENTS

Figure 5A:
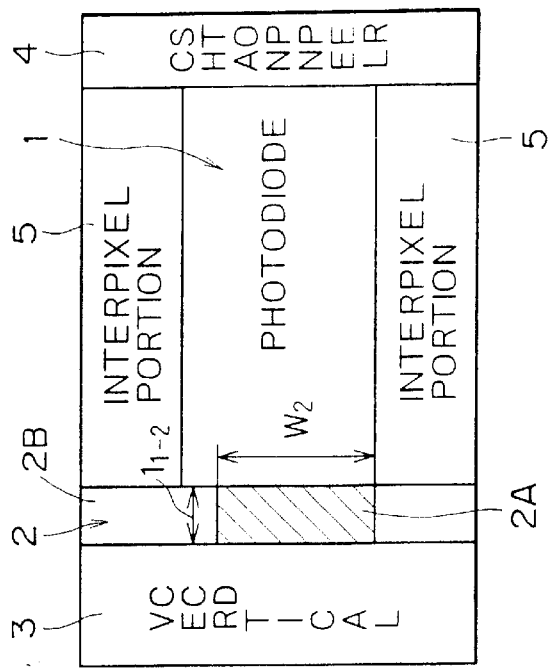
FIGS. 5A and 5B show main portions of another conventional imaging apparatus.
Figure 5B:
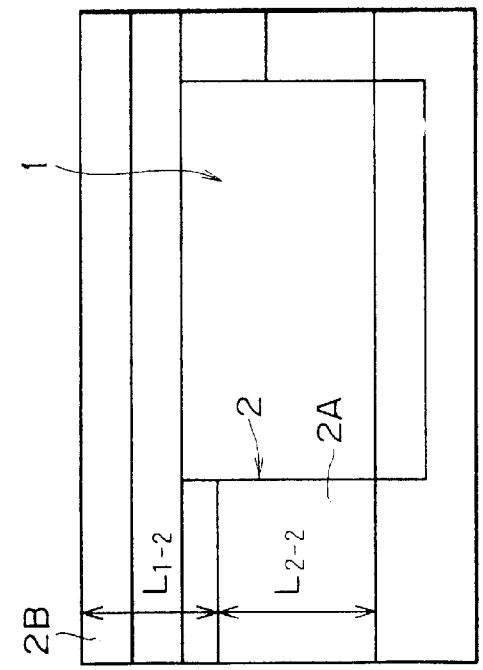
Figure 6A:
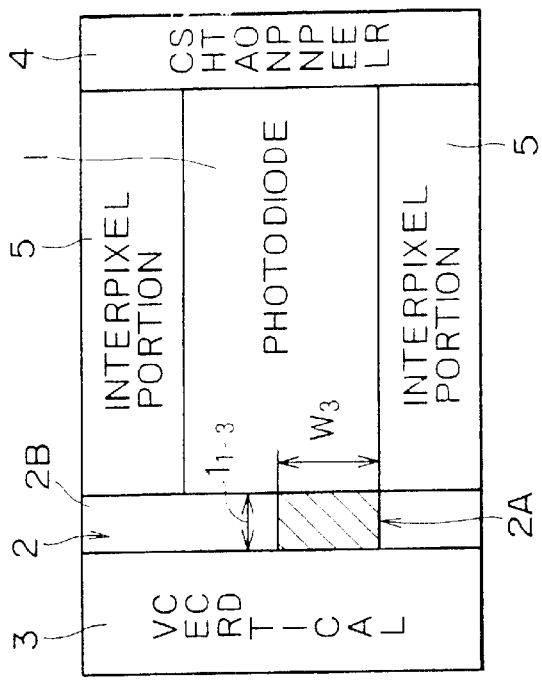
FIGS. 6A and 6B show main portions of yet another conventional imaging apparatus.
Figure 6B:
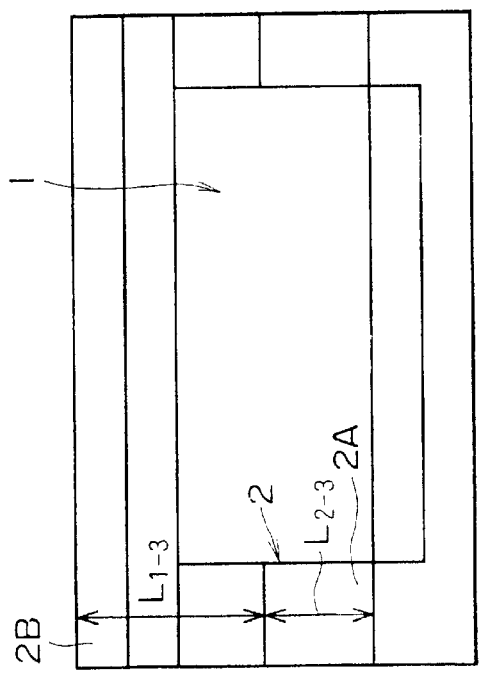

The present invention is preferably constructed as an imaging apparatus in which the light receiving portion has pixels comprising photodiodes and the like, and the charge transfer portion comprises charge coupled devices.

As to the shape of the gate portion, although there are no special limitations thereon, preferably, the gate width is narrower from the light receiving portion toward the transfer portion straightly, curvedly, or gradually.

Furthermore, preferably, the gate portion comprises a first gate portion the gate width of which is narrower from the light receiving portion toward the transfer portion, and a second gate portion provided with an identical gate width from the first gate portion further toward the charge transfer portion.

Hereinafter, the present invention will be described more specifically based on an embodiment of the present invention applied to a CCD imaging apparatus.

FIGS. 1A and 1B show main portions of a CCD imaging apparatus; FIG. 1A is a layout diagram primarily showing a configuration of a gate portion, and FIG. 1B is a layout diagram primarily showing a configuration of a light receiving portion including a vertical CCD portion (hereinafter, the same is also true of other drawings).

In FIGS. 1A and 1B, the numeral number 1 designates a photodiode portion surrounded by a channel stopper portion 4, interpixel portions 5, and a gate portion 12, 3 and the gate portion is adjacent to a vertical CCD portion 3.

In this embodiment, the CCD imaging apparatus is constructed so that a part of a gate 12B of the gate 12 which is not related to charge readout is cut in a slanted line form from a corner of the photodiode portion 1 to the vertical CCD portion 3, as opposed to the gate portion 2 of FIGS. 4A and 4B, whereby the width $L_{2-5}$ or $W_4$ of a gate portion 12a of a readout gate 12A adjacent to the photodiode portion 1 is widened up to the same width as that of the photodiode portion 1 and the width $L_{2-4}$ or $W_4'$ of a gate portion 12b of the readout gate 12A and the gate length $l_{1-4}$ at the vertical CCD portion 3 side is unchanged ($l_{1-4}=l_{1-1}$).

Light from a subject is photoelectrically converted in the photodiode portion 1 and thereby (signal) charges are generated. Applying a voltage to the gate portion 12 (the gate portion 12A goes on) causes the charges of the photodiode portion 1 to be read out to the vertical CCD portion 3 by the readout gate portions 12a and 12b.

The CCD imaging apparatus employs two types of gates, gate portions 12A and 12B. One of them is a gate used during charge readout, and the other is a gate not used for charge readout, placed below the former. In a portion where the two gate overlap, the gate not related to readout is dominant.

This embodiment is characterized in that a gate not related to charge readout is cut in a slanted line form as described above and the width $L_{2-5}$ or $W_4$ of the readout gate portion 12a adjacent to the photodiode portion 1 is widened, so that an electric field applied to that portion is intensified during activation so that charges within the photodiode portion 1 can be easily read out.

Owing to the gate pattern, the gate width $L_{2-4}$ or $W_4'$ at the vertical CCD portion 3 side is the same as conventional ones. Therefore, a gate width adjacent to the vertical CCD portion 3 can be maintained to an optimum width for the charge capacity and charge transfer efficiency of the vertical CCD portion 3 without influencing the charge capacity and charge transfers of the vertical CCD portion 3 and deteriorating other characteristics. Also, since a charge readout voltage is reduced by widening a gate width as described above, power consumption can be reduced. Yet, since the read gate length $l_{1-4}$ is unchanged, the gate serves, during off operation, as an adequate barrier against charges so that there is no leak of charges from the photodiode portion 1 to the vertical CCD portion 3 and no leak of light to the vertical CCD portion 3.

The embodiment shown in FIGS. 2A and 2B is is characterized in that although the entrance gate width $W_4$ of the readout gate portion 12a and the exit gate width $W_4'$ of the readout gate portion 12b are the same as those in FIG. 1, the gate width becomes gradually smaller from the photodiode portion 1 toward the vertical CCD portion 3.

The embodiment shown in FIGS. 3A and 3B is characterized in that the gate width $W_4$ of the readout gate portion 12a becomes curvedly narrower from the photodiode portion 1 toward the vertical CCD portion 3.

It will be appreciated that any of these embodiments can bring about almost the same effect as in FIGS. 1A and 1B.

Although the present invention preferably applies to the above CCD imaging apparatus, without being limited to it, the present invention is widely applicable to other photoelectric converters used for optical communications or other purposes if they are constructed with a light receiving portion, a gate portion, and a charge transfer portion. The patterns of the readout gate portion can be changed to various ones, and layouts including the shapes and sizes of the portions, and devices constituting the light receiving portion are not limited to the above ones.

What is claimed is:

1. A photoelectric converter comprising:
   a light receiving portion having an output end;
   a gate portion having a first side and a second side that both define a readout gate width, the first side confronting the output end of the light receiving portion; and
   a charge transfer portion formed to confront the second side of the gate portion, wherein the readout gate width of said gate portion is wider at the first side confronting said light receiving portion than at the second side confronting said charge transfer portion.

2. The photoelectric converter according to claim 1, wherein said readout gate width narrows linearly from said light receiving portion toward said charge transfer portion.

3. The photoelectric converter according to claim 1, wherein said gate portion comprises a first gate portion having a first readout gate width of which is narrower from said light receiving portion toward said transfer portion, and a second gate portion having a second readout gate width that is constant from said first gate portion towards said charge transfer portion.

4. The photoelectric converter according to claim 1, wherein said photoelectric converter is constructed as an imaging apparatus in which said light receiving portion includes a plurality of pixels and said charge transfer portion includes a plurality of charge coupled devices.

5. The photoelectric converter according to claim 1, wherein said light receiving portion includes photodiodes.

6. The photoelectric converter according to claim 1, wherein said readout gate width narrows curvedly from said light receiving portion toward said charge transfer portion.

7. The photoelectric converter according to claim 1, wherein said readout gate width narrows gradually from said light receiving portion toward said charge transfer portion.

8. The photoelectric converter according to claim 1, wherein said charge transfer portion includes charge coupled devices electrically connected along a vertical axis of the photoelectric converter and disposed adjacent to the gate portion.

9. The photoelectric converter according to claim 1, wherein said gate portion comprises a barrier gate portion and a readout gate portion having the first and the second sides of the gate portion, the barrier portion is disposed between said charge transfer portion and said light receiving portion and has a tapered side defined by the readout gate width of the readout gate portion.

10. The photoelectric converter according to claim 1, wherein said gate portion substantially prevents leaking of a charge held by the light receiving portion when said gate portion is in an OFF state.

* * * * *